United States Patent
Lin et al.

(10) Patent No.: US 6,608,388 B2
(45) Date of Patent: Aug. 19, 2003

(54) DELAMINATION-PREVENTING SUBSTRATE AND SEMICONDUCTOR PACKAGE WITH THE SAME

(75) Inventors: Yuan-Fu Lin, Taichung (TW); Wen-Ta Tsai, Taichung (TW)

(73) Assignee: Siliconware Precision Industries Co., Ltd. (TW)

(*) Notice: Subject to any disclaimer, the term of this patent is extended or adjusted under 35 U.S.C. 154(b) by 0 days.

(21) Appl. No.: 10/174,616

(22) Filed: Jun. 19, 2002

(65) Prior Publication Data

US 2003/0080439 A1 May 1, 2003

(30) Foreign Application Priority Data

Nov. 1, 2001 (TW) ........................... 90127122 A

(51) Int. Cl.$^7$ ............................................... H01L 23/29
(52) U.S. Cl. .................... 257/783; 257/784; 257/676; 257/786
(58) Field of Search ................. 257/783, 784, 257/676, 786

(56) References Cited

U.S. PATENT DOCUMENTS

| | | | |
|---|---|---|---|
| 5,703,402 A | 12/1997 | Chu et al. | 257/737 |
| 5,801,440 A | 9/1998 | Chu et al. | 257/691 |
| 6,329,228 B1 * | 12/2001 | Terashima | 438/156 |

* cited by examiner

*Primary Examiner*—Kamand Cuneo
*Assistant Examiner*—Luan Thai
(74) *Attorney, Agent, or Firm*—Peter F. Corless; Steven M. Jensen; Edwards & Angell, LLP

(57) ABSTRACT

A delamination-preventing substrate and a semiconductor package with the substrate are provided. A metal layer and a solder mask layer are sequentially laminated on a chip attach area of a substrate, and both formed with corresponding openings for partly exposing the substrate. This allows an adhesive for chip-bonding use to be directly attached to the substrate via the openings, so as to reduce contact area between the adhesive and the metal layer, and to increase bonding between the substrate and a chip mounted on the substrate by means of the adhesive. Direct contact between the adhesive and the substrate also helps reduce stress generated between the chip and substrate, thereby preventing stress-induced delamination. Due to weak adhesion between adhesive and metal materials, reduced contact area between the adhesive and the metal layer would further enhance bonding of the chip to the substrate, thereby assuring quality of fabricated package products.

15 Claims, 4 Drawing Sheets

DELAMINATION-PREVENTING SUBSTRATE AND SEMICONDUCTOR PACKAGE WITH THE SAME

FIELD OF THE INVENTION

The present invention relates to substrates and semiconductor packages with the substrates, and more particularly, to a substrate for preventing delamination between the substrate and a chip mounted on the substrate.

BACKGROUND OF THE INVENTION

As shown in FIGS. 3(A) and 3(B), a conventional substrate 10 for use with a BGA (ball grid array) semiconductor package is formed with a chip attach area 11, and a metal layer (usually copper) is applied over the chip attach area 11; the metal layer completely covers the chip attach area 11, and is therefore designated by the same reference numeral 11. A solder mask layer 12 is then applied over the substrate 10 and the metal layer 11, and formed with a plurality of openings 13 for allowing a portion of the metal layer 11 to be exposed. For mounting a chip (not shown) on the substrate 10, an adhesive (not shown) is spread over the chip attach area 11 to fill into the openings 13 and to be attached to the solder mask layer 12 and the exposed portion of the metal layer 11, such that the chip can be bonded to the substrate 10 by means of the adhesive. However, the above structure has significant drawbacks. First, with the chip attach area 11 being entirely covered by the metal layer 11, the solder mask layer 12 applied over the metal layer 11 may be easily subject to delamination at interface between the solder mask layer 12 and the metal layer 11 due to weak adhesion between solder mask and metal materials. Moreover, the adhesive for chip bonding is attached to the metal layer 11 and the solder mask layer 12; however, due to weak adhesion between adhesive and metal materials, delamination may occur at interface between the adhesive and the metal layer 11, and further extend to interface between the adhesive and the solder mask layer 12, thereby severely damaging bonding between the chip and the substrate 10.

Therefore, U.S. Pat. Nos. 5,703,402 and 5,801,440 disclose another BGA substrate 20 illustrated in FIGS. 4(A) and 4(B). As shown in FIG. 4(A), this substrate 20 is characterized by forming a metal layer 22 of a sunray shape without entirely covering a chip attach area 21 on the substrate 20. A solder mask layer 23 is applied over the substrate 20 and the metal layer 22, and formed with a plurality of openings 24 for allowing a portion of the metal layer 22 to be exposed. As part of the chip attach area 21 of the substrate 20 is uncovered by the sunray-shaped metal layer 22, the solder mask layer 23 can be directly attached to the uncovered part of the chip attach area 21, which increases bonding between the solder mask layer 23 and the substrate 20 due to relatively strong adhesion between solder mask and substrate materials, thereby helping prevent delamination problems from occurrence. However, when an adhesive (not shown) for chip-bonding use is applied over the chip attach area 21 of the substrate 20, the adhesive is still attached to the solder mask layer 23 and the exposed portion of the metal layer 22, without resolving the drawback of delamination at adhesive-substrate interface as described above for the previous conventional substrate 10.

Therefore, the problem to be solved is to provide a substrate for improving adhesion between an adhesive and the substrate and for assuring bonding of a chip to the substrate.

SUMMARY OF THE INVENTION

An objective of the present invention is to provide a delamination-preventing substrate and a semiconductor package with the same, so as to enhance bonding between the substrate and a chip mounted on the substrate.

Another objective of the invention is to provide a delamination-preventing substrate and a semiconductor package with the same, so as to effectively reduce stress generated between the substrate and a chip mounted on the substrate.

A further objective of the invention is to provide a delamination-preventing substrate and a semiconductor package with the same, so as to prevent delamination at interface between the substrate and a chip mounted on the substrate.

In accordance with the above and other objectives, the present invention proposes a delamination-preventing substrate and a semiconductor package with the substrate. The semiconductor package comprises: a substrate having a first surface and a second surface opposed to the first surface, the first surface being formed with a chip attach area that is covered by a metal layer thereon, wherein a solder mask layer is applied over the metal layer and the first surface of the substrate, and formed with a plurality of first openings corresponding in position to the metal layer, allowing a portion of the metal layer to be exposed to the first openings, and the exposed portion of the metal layer is formed with a plurality of second openings respectively within the first openings, so as to partly expose the first surface of the substrate to the second openings; at least a chip having a first surface and a second surface opposed to the first surface, wherein the second surface of the chip is attached to the chip attach area on the first surface of the substrate; an adhesive layer for attaching the second surface of the chip to the chip attach area of the substrate, wherein the adhesive layer fills into the first and second openings to be in contact with the exposed part of the first surface of the substrate; a plurality of bonding wires bonded to the first surface of the chip and to the first surface, outside the chip attach area, of the substrate, so as to electrical connect the chip to the substrate by means of the bonding wires; an encapsulant formed on the first surface of the substrate for encapsulating the chip and the bonding wires; and a plurality of solder bumps implanted on the second surface of the substrate for electrically connecting the chip to an external device.

The metal layer on the substrate is of a sunray shape, and partly covers the chip attach area, such that the solder mask layer can be directly attached to uncovered part of the chip attach area, so as to increase bonding between the solder mask layer and the substrate. Moreover, with the forming of the first and second openings, the adhesive layer is adapted to be in direct contact with exposed part of the first surface of the substrate; this is the characteristic feature of the invention. This structural arrangement is used to reduce contact area between the adhesive layer and the metal layer, and increase contact area between the adhesive layer and the substrate. As adhesion between adhesive and substrate materials is stronger than adhesion between adhesive and metal materials, direct contact between the adhesive layer and the substrate helps enhance bonding between the chip and the substrate, without easily subject to delamination at chip-substrate interface as in the prior art. Further due to direct contact between the adhesive layer and the substrate, the adhesive layer can help reduce stress generated between the chip and the substrate, so as to prevent stress-induced delamination from occurrence.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Figure 1A:
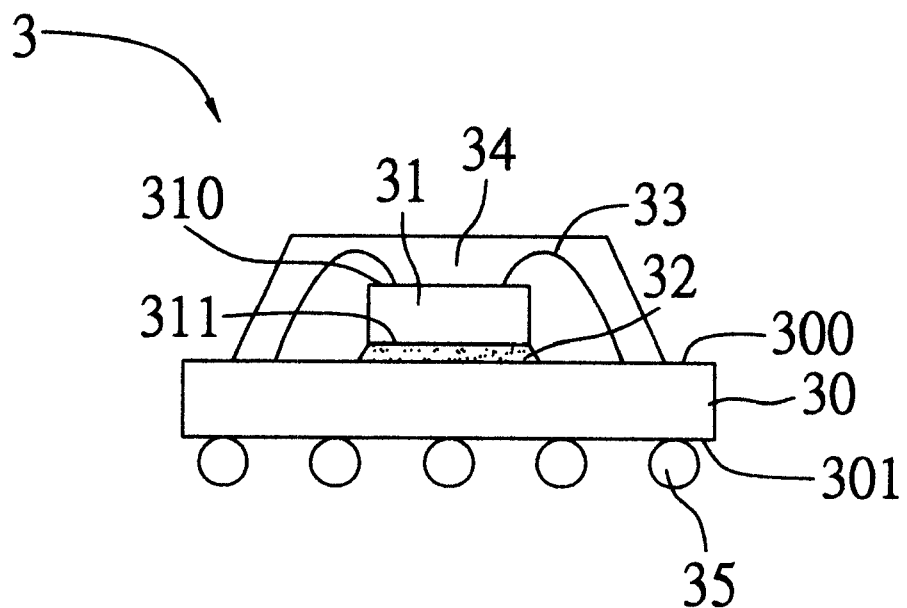
FIG. 1(A) is a cross-sectional view of a semiconductor package according to the invention.
Figure 1B:
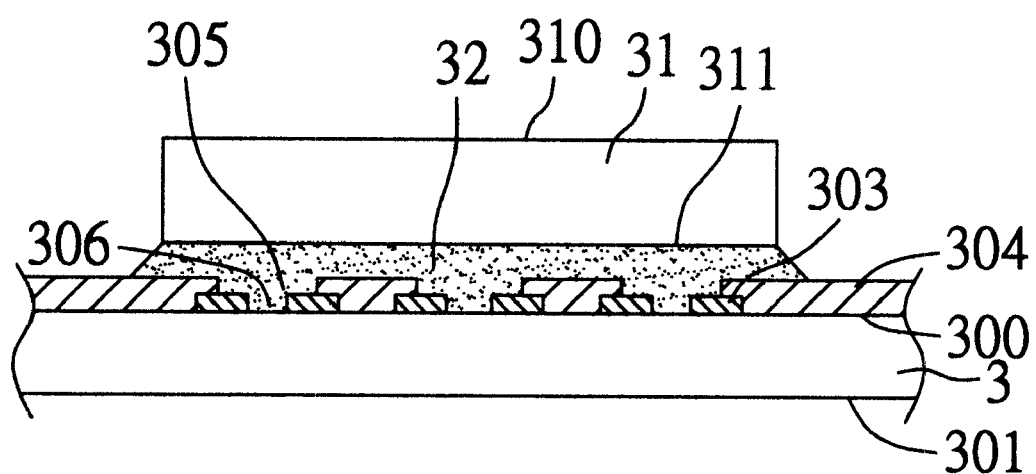
FIG. 1(B) is a cross-sectional view showing bonding between a chip and a substrate used in the semiconductor package of FIG. 1(A)
Figure 2:
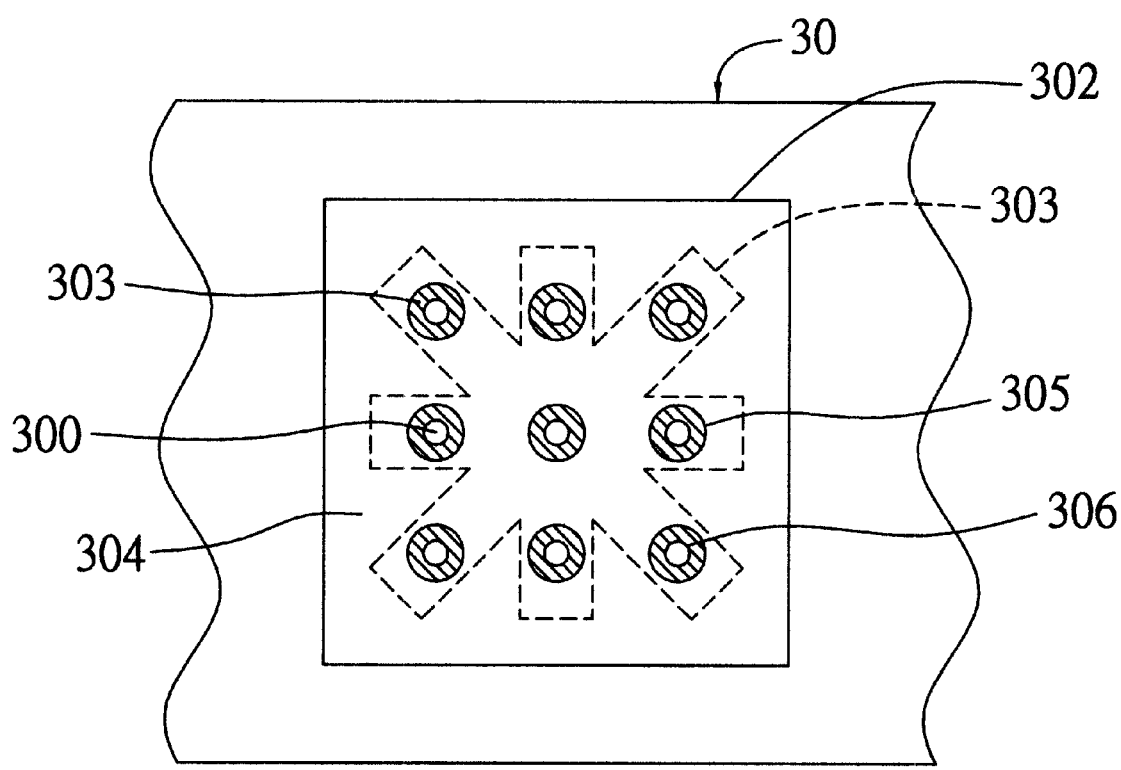
FIG. 2 is a top view of a substrate according to the invention.

FIGS. 1(A), 1(B) and 2 illustrate a semiconductor package 3 and a substrate 30 according to the invention. As shown in FIGS. 1(A), 1(B) and 2, the semiconductor package 3 comprises: a substrate 30 having a first surface 300 and a second surface 301 opposed to the first surface 300, wherein the first surface 300 of the substrate 30 is defined with a chip attach area 302; at least a chip 31 having a first surface 310 and a second surface 311 opposed to the first surface 310, wherein the second surface 311 of the chip 31 is mounted on the chip attach area 302 of the substrate 30; an adhesive layer 32 for attaching the second surface 311 of the chip 31 to the chip attach area 302 of the substrate 30; a plurality of bonding wires 33 bonded to the first surface 310 of the chip 31 and to the first surface 300, outside the chip attach area 302, of the substrate 30, so as to electrically connect the chip 31 to the substrate 30 by means of the bonding wires 33; an encapsulant 34 formed on the first surface 300 of the substrate 30, for encapsulating the chip 31 and the bonding wires 33; and a plurality of solder balls 35 implanted on the second surface 301 of the substrate 30, for electrically connecting the chip 31 to an external device (not shown).

The substrate 30 is made of a conventional resin material such as BT (bismaleimide triazine) resin etc. A metal layer 303 of a sunray shape is formed on the chip attach area 302, and a solder mask layer 304 is applied over the metal layer 303 and the first surface 300 of the substrate 30. The solder mask layer 304 is formed with a plurality of first openings 305 corresponding in position to the metal layer 304 in a manner that, a portion of the metal layer 304 is exposed to the openings 305. The exposed portion of the metal layer 304 is then formed with a plurality of second openings 306 respectively within the first openings 305, so as to partly expose the first surface 300 of the substrate 30 to the second openings 306, wherein each of the second openings 306 is smaller in size than a corresponding one of the first openings 305. As forming of the first and second openings 305, 306 employs conventional technology, it is not to be further described herein. The first and second openings 305, 306 are of, but not limited to, a circular shape as illustrated in FIG. 2; it should be understood that, other shapes are suitably adopted herein and pertained to the scope of the invention.

Figure 3A:
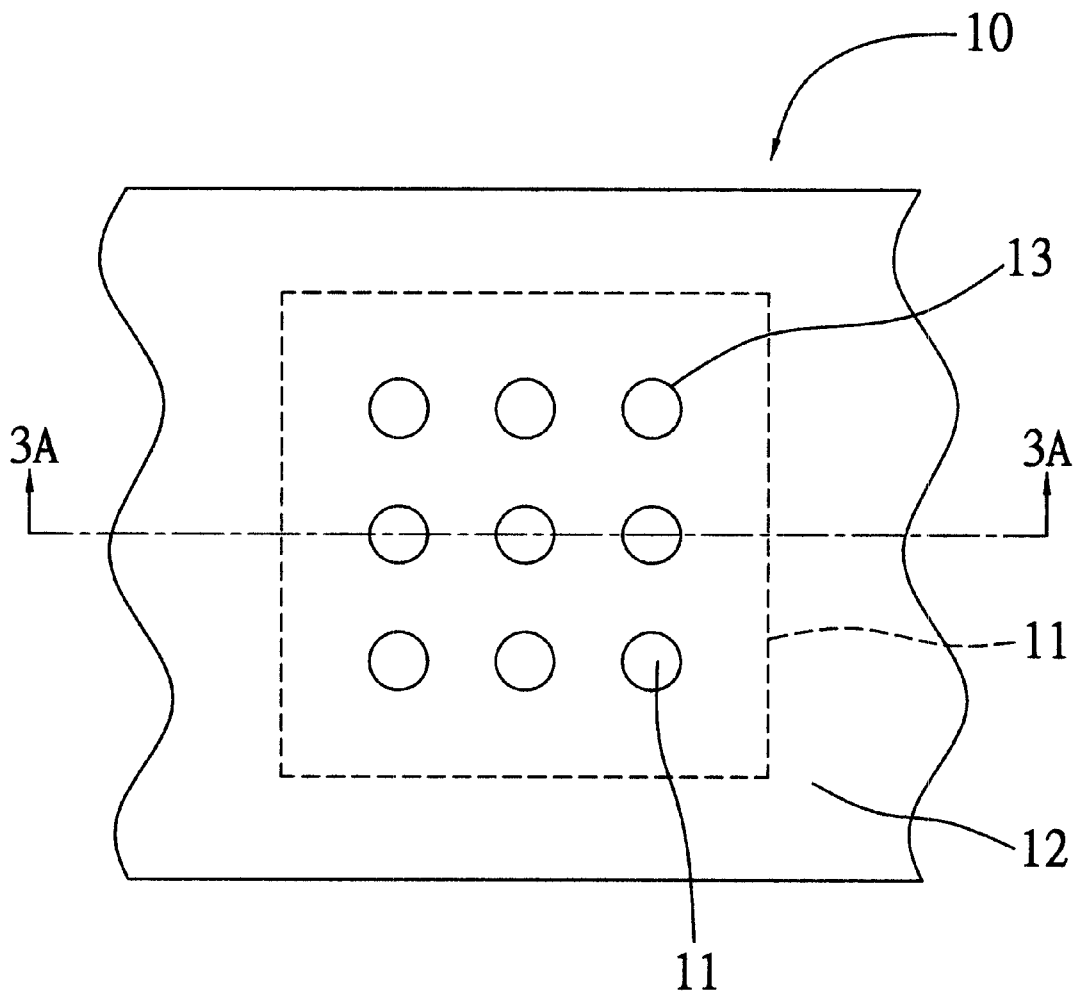
FIG. 3(A) (PRIOR ART) is a top view of a conventional substrate.
Figure 3B:
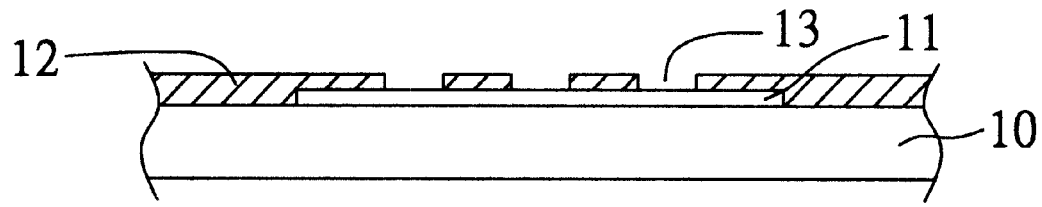
FIG. 3(B) (PRIOR ART) is a cross-sectional view of the substrate of FIG. 3(A) cutting along a line 3A—3A.

Moreover, the sunray-shaped metal layer 303 on the substrate 30 does not cover entire of the chip attach area 302, such that part of the chip attach area 302 is exposed to outside of the metal layer 303 and in direct contact with the solder mask layer 304, thereby increasing bonding between the solder mask layer 304 and the substrate 30 due to relatively strong adhesion between solder mask and substrate materials. Compared to the prior art technology illustrated in FIGS. 3(A) and 3(B) with the drawback of delamination between the solder mask layer 12 and the metal layer 11 that completely covers the chip attach area 11 on the substrate 10, the sunray design of the metal layer 303 is therefore beneficial of desirably eliminating the delamination problem.

Figure 4A:
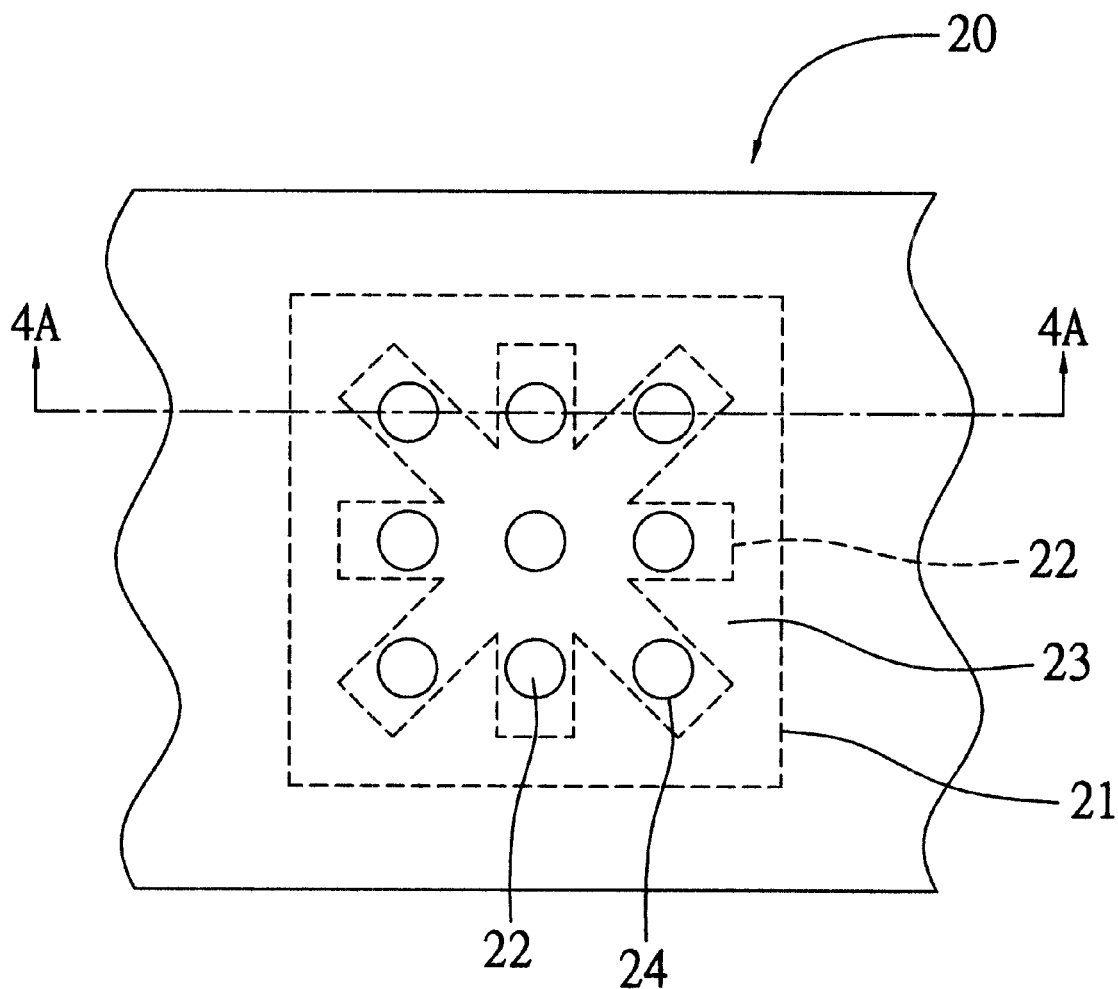
FIG. 4(A) (PRIOR ART) is a top view of another conventional substrate.
Figure 4B:
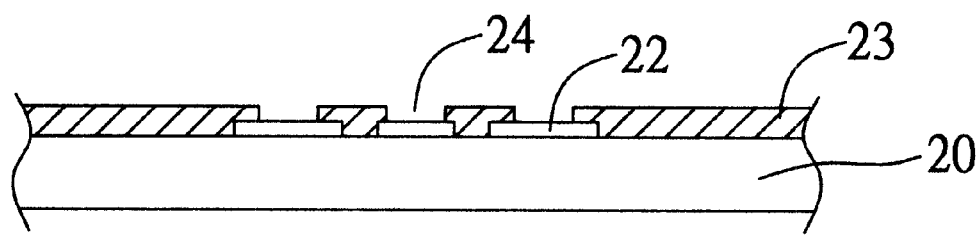
FIG. 4(B) (PRIOR ART) is a cross-sectional view of the substrate of FIG. 4(A) cutting along a line 4A—4A.

The adhesive layer 32 is made of a conventional adhesive such as silver paste, and applied over the chip attach area 302 on the substrate 30 to fill into the first and second openings 305, 306, whereby the second surface 311 of the chip 31 is attached to the adhesive layer 32 for mounting the chip 31 on the substrate 30. As part of the first surface 300 of the substrate 30 is exposed to the second openings 306, the adhesive layer 32 can be in direct contact with the exposed part of the first surface 300 and firmly attached to the substrate 30; this is the characteristic feature of the invention. This structural arrangement is used to reduce contact area between the adhesive layer 32 and the metal layer 303, and increase contact area between the adhesive layer 32 and the substrate 30; as adhesion between adhesive and substrate materials is greater than adhesion between adhesive and metal materials, direct contact between the adhesive layer 32 and the substrate 30 would desirably enhance bonding between the chip 31 and the substrate 30 by means of the adhesive layer 32, without being easily subject to delamination at chip-substrate interface as in the prior art (illustrated in FIGS. 3 and 4). Moreover, increase in contact area between the adhesive layer 32 and the substrate 30 further helps reduce stress generated between the chip 31 and the substrate 30, so as to prevent stress-induced delamination from occurrence.

The bonding wires 33, such as gold wires, are bonded to bond pads (not shown) formed on the first surface 310 of the chip 31 and to the first surface 300, outside the chip attach area 302, of the substrate 30, so as to electrical connect the chip 31 to the substrate 30 by means of the bonding wires 33. The encapsulant 34 is made of a conventional resin compound such as epoxy resin, and formed on the first surface 300 of the substrate 30, so as to hermetically encapsulate the chip 31 and the bonding wires 33, and to protect internal components of the semiconductor package 3 against external moisture and contaminant. The solder balls 35 are implanted on the second surface 301 of the substrate 30, for electrically connecting the chip 31 to an external device such as printed circuit board (PCB, not shown). As wire-bonding, encapsulant-forming and ball-implanting processes are conventional technology, they are not to be further detailed herein.

Therefore, the above semiconductor package 3 according to the invention can provide significant benefits. With the adhesive layer 32 being directly attached to the substrate 30 via the second openings 306, the chip 31 can be more firmly bonded to the substrate 30 without easily subject to delamination at chip-substrate interface. Further due to direct contact between the adhesive layer 32 and the substrate 30, the adhesive layer 32 can effectively reduce stress generated between the chip 31 and the substrate 30, so as to prevent stress-induced delamination from occurrence. Moreover, due to weak adhesion between adhesive and metal materials, reduced contact area between the adhesive layer 32 and the metal layer 303 would help enhance bonding between the chip 31 and the substrate 30, thereby assuring quality of fabricated package products.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a delamination-preventing substrate, the semiconductor package comprising:
    a substrate having a first surface and a second surface opposed to the first surface, the first surface being formed with a chip attach area that is covered by a metal layer thereon, wherein a solder mask layer is applied over the metal layer and the first surface of the substrate, and formed with a plurality of first openings corresponding in position to the metal layer, allowing a portion of the metal layer to be exposed, and the exposed portion of the metal layer is formed with a plurality of second openings respectively within the first openings, so as to partly expose the first surface of the substrate to the second openings;
    at least a chip having a first surface and a second surface opposed to the first surface, wherein the second surface of the chip is attached to the chip attach area on the first surface of the substrate;
    an adhesive layer for attaching the second surface of the chip to the chip attach area of the substrate, wherein the adhesive layer fills into the first and second openings to be in contact with the exposed part of the first surface of the substrate;
    a plurality of bonding wires bonded to the first surface of the chip and to the first surface, outside the chip attach area, of the substrate, so as to electrical connect the chip to the substrate by means of the bonding wires;
    an encapsulant formed on the first surface of the substrate, for encapsulating the chip and the bonding wires; and
    a plurality of solder bumps implanted on the second surface of the substrate, for electrically connecting the chip to an external device.

2. The semiconductor package of claim 1, wherein the substrate is made of BT (bismaleimide triazine) resin.

3. The semiconductor package of claim 1, wherein the metal layer is a copper layer.

4. The semiconductor package of claim 1, wherein the metal layer covers part of the chip attach area.

5. The semiconductor package of claim 4, wherein the metal layer is of a sunray shape.

6. The semiconductor package of claim 1, wherein each of the second openings is smaller in size than a corresponding one of the first openings.

7. The semiconductor package of claim 1, wherein the adhesive layer is made of silver paste.

8. The semiconductor package of claim 1, wherein the bonding wires are gold wires.

9. The semiconductor package of claim 1, wherein the encapsulant is made of a resin compound.

10. A delamination-preventing substrate, comprising:
    a first surface and a second surface opposed to the first surface, wherein the first surface is formed with a chip attach area;
    a metal layer applied over the chip attach area of the first surface; and
    a solder mask layer applied over the metal layer and the first surface of the substrate, and formed with a plurality of first openings corresponding in position to the metal layer, allowing a portion of the metal layer to be exposed to the first openings, wherein the exposed portion of the metal layer is formed with a plurality of second openings respectively within the first openings, so as to partly expose the first surface of the substrate to the second openings.

11. The delamination-preventing substrate of claim 10, wherein the substrate is made of BT (bismaleimide triazine) resin.

12. The delamination-preventing substrate of claim 10, wherein the metal layer is a copper layer.

13. The delamination-preventing substrate of claim 10, wherein the metal layer covers part of the chip attach area.

14. The delamination-preventing substrate of claim 13, wherein the metal layer is of a sunray shape.

15. The delamination-preventing substrate of claim 10, wherein each of the second openings is smaller in size than a corresponding one of the first openings.

* * * * *